US012696577B2

(12) United States Patent
Tang et al.

(10) Patent No.: US 12,696,577 B2
(45) Date of Patent: Jul. 28, 2026

(54) SOLAR CELL

(71) Applicant: REC SOLAR PTE. LTD., Singapore (SS)

(72) Inventors: Muzhi Tang, Singapore (SG); Shu Yunn Chong, Singapore (SG)

(73) Assignee: REC SOLAR PTE. LTD., Singapore (SG)

( * ) Notice: Subject to any disclaimer, the term of this patent is extended or adjusted under 35 U.S.C. 154(b) by 10 days.

(21) Appl. No.: 18/259,977

(22) PCT Filed: Dec. 20, 2021

(86) PCT No.: PCT/EP2021/086837
§ 371 (c)(1),
(2) Date: Jun. 29, 2023

(87) PCT Pub. No.: WO2022/144214
PCT Pub. Date: Jul. 7, 2022

(65) Prior Publication Data
US 2024/0088313 A1 Mar. 14, 2024

(30) Foreign Application Priority Data

Dec. 30, 2020 (GB) ..................................... 2020727

(51) Int. Cl.
*H10F 10/166* (2025.01)
*H10F 71/00* (2025.01)
*H10F 77/70* (2025.01)

(52) U.S. Cl.
CPC ......... *H10F 77/707* (2025.01); *H10F 10/166* (2025.01); *H10F 71/1215* (2025.01)

(58) Field of Classification Search
None
See application file for complete search history.

(56) References Cited

U.S. PATENT DOCUMENTS

| | | | |
|---|---|---|---|
| 9,276,155 B2 | 3/2016 | Muenzer et al. | |
| 2007/0151599 A1 | 7/2007 | Cousins | |

(Continued)

FOREIGN PATENT DOCUMENTS

| | | |
|---|---|---|
| CN | 111525037 A | 8/2020 |
| EP | 0698929 A2 | 2/1996 |

(Continued)

OTHER PUBLICATIONS

Kruss Scientific, Roughness (Surface Roughness), https://www.kruss-scientific.com/en-us/know-how/glossary/roughness, downloaded Nov. 25, 2024. (Year: 2024).*

(Continued)

*Primary Examiner* — Jayne L Mershon
(74) *Attorney, Agent, or Firm* — Lee & Hayes, P.C.

(57) ABSTRACT

A solar cell comprising a substrate having a front surface configured to face a light source in use, and a rear surface opposite the front surface. The front surface has a front surface morphology and the rear surface has a rear surface morphology. The front and rear surface morphologies are configured such that the front surface has a greater surface area than the rear surface. The solar cell also includes an emitter arranged on the rear surface of the substrate. Also disclosed is a method of forming a layered structure of a solar cell, which includes performing finishing processes such that a first (e.g. front) surface of a substrate has a greater surface area than a second (e.g. rear) surface. The method further includes providing a reflector layer that may be tuned to the morphology of the second surface.

20 Claims, 3 Drawing Sheets

(56) References Cited

U.S. PATENT DOCUMENTS

| | | | |
|---|---|---|---|
| 2009/0211627 A1 | 8/2009 | Meier et al. | |
| 2010/0193027 A1 | 8/2010 | Ji et al. | |
| 2013/0061924 A1* | 3/2013 | Munzer | H01L 31/056 |
| | | | 257/E31.124 |
| 2013/0164879 A1 | 6/2013 | Cousins et al. | |
| 2016/0300963 A1 | 10/2016 | Kuo et al. | |
| 2017/0062633 A1* | 3/2017 | Carlson | H01L 31/022441 |
| 2020/0132900 A1* | 4/2020 | Furuta | B42D 25/328 |
| 2020/0279968 A1* | 9/2020 | Bende | H10F 10/146 |

FOREIGN PATENT DOCUMENTS

| | | | |
|---|---|---|---|
| EP | 2922101 A1 | 9/2015 | |
| JP | H08-64849 A | 3/1996 | |
| JP | 2009521805 A | 6/2009 | |
| JP | 2010103347 A | 5/2010 | |
| JP | 2012142568 A | 7/2012 | |
| JP | 2012145431 A | 8/2012 | |
| JP | 2012191187 A | 10/2012 | |
| JP | 2014204028 A | 10/2014 | |
| JP | 2015158499 A | 9/2015 | |
| JP | 2017107964 A | 6/2017 | |
| JP | 2017112379 A | 6/2017 | |
| KR | 20180084737 A | 7/2018 | |
| TW | 201218389 A | 5/2012 | |
| WO | WO2007081510 A2 | 7/2007 | |
| WO | WO2011025371 A1 | 3/2011 | |
| WO | WO2012105148 A1 | 8/2012 | |
| WO | WO2012115519 A2 | 8/2012 | |
| WO | WO2016163168 A1 | 10/2016 | |

OTHER PUBLICATIONS

Refractive Index Database at refractiveindex.info, Indium Tin Oxide, https://refractiveindex.info/?shelf=other&book=In2O3-SnO2&page=Konig#google_vignette, downloaded Jun. 5, 2025 (Year: 2025).*

Refractive Index Database, Silver at refractiveindex.info, https://refractiveindex.info/?shelf=main&book=Ag&page=Johnson, downloaded Jun. 5, 2025 (Year: 2025).*

Great Britain Search Report mailed Sep. 8, 2021 in Great Britain Application No. GB2020727.0, a corresponding foreign application, 2 pages.

International Search Report and Written Opinion mailed Apr. 25, 2022 in International Application No. PCT/EP2021/086837, 16 pages.

Yang, Y. et al., Novel planar rear surface reflector design for crystalline silicon solar cells, Proceedings, 26th European Photovoltaic Solar Energy Conference and Exhibition: The Most Inspiring Platform for the Global PV Solar Sector, CCH Congress Centre and International Fiar, Hambug, Germany, Sep. 5-9, 2011, Exh. 5, Oct. 13, 2011, pages.

Office Action for Japanese Application No. 2023-540681, Dated Nov. 4, 2025, 11 pages.

Office Action for Korean Application No. 10-2023-7025952, Dated Oct. 31, 2025, 16 pages.

Office Action for Taiwanese Application No. 110147732, Dated Aug. 1, 2025, 24 pages.

Office Action for Vietnamese Application No. 1-2023-04863, Dated Nov. 18, 2025, 4 pages.

* cited by examiner

200

PROVIDE A CRYSTALLINE SILICON WAFER (201)

↓

TEXTURE SURFACES OF SUBSTRATE (202)

↓

REMOVE TEXTURE FROM REAR SURFACE (203)

↓

ARRANGE LAYERS ON FRONT/REAR SURFACES (204)

↓

ARRANGE ELECTRODES ON OUTER SURFACES (205)

300

| REFLECTOR LAYER CONFIGURATION | | PERFORMANCE CHARACTERISTIC (Jsc) | |
|---|---|---|---|
| MATERIAL 1 THICKNESS (nm) | MATERIAL 2 THICKNESS (nm) | MORPHOLOGY 1 | MORPHOLOGY 2 |
| 70 | 0 | 41.05 | 41.11 |
| 70 | 10 | 41.08 | 41.12 |
| 70 | 20 | 41.01 | 41.16 |
| 70 | 40 | 41.02 | 41.09 |
| 40 | 0 | 41.07 | 41.28 |
| 40 | 10 | 41.1 | 41.3 |
| 40 | 20 | 41.07 | 41.25 |
| 40 | 40 | 41.09 | 41.19 |

SOLAR CELL

CROSS-REFERENCE TO RELATED APPLICATIONS

This application is a U.S. National Phase Application of International Application No. PCT/EP2021/086837 filed Dec. 20, 2021, which claims priority to Great Britain Application No. 2020727.0 filed Dec. 30, 2020, both of which are incorporated herein by reference in their entirety.

FIELD OF THE DISCLOSURE

The present disclosure relates to solar cells and methods for forming solar cells. The present disclosure may be particularly, but not exclusively, applicable to heterojunction solar cells and methods of forming such solar cells.

BACKGROUND

Solar modules for providing electrical energy from sunlight comprise an array of solar/photovoltaic cells, each comprising a semiconductor substrate. The semiconductor substrate forms a p-n junction with an emitter (i.e. one of the substrate and emitter being an N-type material and the other being a P-type), which facilitates the generation of an electric current in response to light incident on the solar cell.

To maximise the efficiency of such solar cells, it is important to reduce the amount of light that is reflected (by various layers of the solar cell) back into the surrounding air. This is because such reflected light cannot then be used by the solar cell to generate an electrical current.

One way this reflection of light can be reduced is by texturing the surfaces of the semiconductor substrate. One commonly used form of texturing is pyramid texturing, which results in a surface made up of pyramids protruding therefrom. This texture can be formed by placing a silicon wafer in a chemical bath to etch along the faces of the wafer, which results in the pyramid texture being formed on those faces due to the chemical structure of the silicon.

Even with such texturing, however, not all light is absorbed by the substrate for use in the generation of the electrical current. Some light is still reflected into the surrounding air, some light is absorbed by non-electricity generating layers of the cell, and some light passes straight through the substrate.

The more light available for use by the solar cell to generate electricity, the greater the efficiency of the solar cell. Accordingly, there is an ongoing need to increase the amount of light that is retained within a solar cell (rather than being reflected to the external environment or passing straight through the solar cell).

Another source of efficiency loss is surface defects which can form at the interfaces between different layers of a solar cell. In operation, charge carriers recombine at defect sites located near to the p-n junction, instead of being collected by the electrodes. This recombination of charge carriers can result in decreased photovoltaic conversion efficiency of the solar cell.

SUMMARY

According to a first aspect there is provided a solar cell comprising:

a substrate having a front surface configured to face a light source in use, and a rear surface opposite the front surface, the front surface having a front surface morphology and the rear surface having a rear surface morphology, wherein the front and rear surface morphologies are configured such that the front surface has a greater surface area than the rear surface; and an emitter arranged on the rear surface of the substrate.

By providing a rear surface of the substrate with a smaller surface area (i.e. via surface morphology), the rear surface (and consequently a rear side of the solar cell) may be more reflective than the front surface of the substrate (and a front side of the solar cell). The front surface is configured to face a light source (such as the sun) in use, such that light is first incident on the front surface. The larger surface area of the front surface means the amount of light reflected by the front side of the solar cell may be minimised (to maximise light passing into the substrate), and the amount of light reflected by the rear side of the solar cell may be maximised (to maximise the amount of light reflected back into the substrate). This may increase the performance of the solar cell.

Further, by providing the substrate with one surface that has a smaller surface area, surface recombination at that surface may be reduced (which can, again, improve the performance of the solar cell).

Additionally, providing the rear surface with a smaller surface area may reduce the quantity of material required for each layer applied to (e.g. deposited on) the rear surface. This may reduce both the time it takes to apply such layers and the cost of the materials for those layers.

The term "on", as used herein, for example in the phrase "arranged on the rear surface", is intended to encompass both direct and indirect arrangement on an element such as e.g. the substrate, a surface or a layer. Thus, the term "on" encompasses arrangements in which one or more intervening layers are provided or, alternatively, in which no intervening layers are provided. In contrast, when an element is referred to as being "directly on" another element (e.g. "directly on a surface"), there are no intervening elements present. The emitter may therefore be arranged either directly or indirectly on the rear surface of the substrate.

As the emitter is arranged on the rear surface of the substrate, it may be referred to as a rear emitter, and the solar cell may be referred to as a rear emitter solar cell.

The term "morphology" is used herein to describe the form or structure of the surface as opposed to, for example, the extent (e.g. envelope or footprint) of the surface.

Accordingly, the substrate may comprise a substantially rectangular cross-sectional shape (the cross-section being taken orthogonal to the front/rear surfaces). The front and rear surfaces may thus be substantially the same size (i.e. in regards to envelope, footprint, or the two dimensional projection of each surface).

The front surface may be textured (i.e. the front surface morphology may comprise a texture). For example, the front surface morphology may comprise a pyramid texture. The front surface morphology may comprise pyramids having sides that each form about a 55 degree slope with horizontal.

The rear surface may be substantially untextured. That is, the rear surface morphology may be smooth and planar. Alternatively, the rear surface may be textured (albeit differently to the front surface). The rear surface may be e.g. polished or micro-etched. For example, the rear surface may comprise a polished pyramid texture. The rear surface morphology may comprise smooth bumps. The rear surface morphology may comprise pyramids with their tips removed.

The rear surface morphology may comprise pyramids (with or without removed tips) having sides that each form a lower degree angle slope with horizontal compared to pyramids of the front surface morphology. The pyramids of the rear surface may have slope angles of less than 54 degrees. For example, the pyramids of the rear surface may have slope angles of about 40% to 60% (e.g. about 50%) of those of the pyramids of the front surface. In a specific example embodiment, the pyramids of the rear surface have sides that each form a 30 degree slope with horizontal as compared to the pyramids of the front surface which have sides that each form a 55 degree slope with horizontal.

The surface roughness of the front surface may be greater than the surface roughness of the rear surface. The term "surface roughness" used herein is a reference to the "Developed Interfacial Area Ratio (Sdr)" of the surface, calculated as follows:

$$Sdr = \frac{(\text{Actual surface area}) - (\text{Projected Area})}{(\text{Projected Area})}$$

where the projected area is the two-dimensional projection of the (three-dimensional) surface (i.e. the cross-sectional area). A completely smooth/flat surface will have an Sdr value of zero (because in such a scenario, actual surface area is equal to projected area).

The substrate and emitter may form part of a layered structure of the solar cell. The substrate may divide the layered structure into a front side (or portion) that includes, and is forward of, the front surface of the substrate, and a rear side (or portion) that includes, and is rearward of, the rear surface of the substrate. Thus, the emitter may form part of a rear side of the layered structure. One or more layers may be arranged on the front surface of the substrate. One or more layers, in addition to the emitter, may be arranged on the rear surface of the substrate.

The term "forward" is used to describe a direction towards the front surface of the solar cell (i.e. towards a source of incident light, e.g. the sun, in normal use). The term "rearward" is used herein to describe a direction towards a rear surface of the solar cell (i.e. directed away from the source of incident light in normal use).

One or more of the layers arranged on the surface(s) of the substrate may be deposited on the surface(s) in the form of a thin coating. In this way, the layers may have substantially the same surface morphology as the underlying substrate surface. For example, each layer may have a thickness that is significantly smaller than the height of any texture (e.g. pyramids) formed on the surface of the substrate.

The rear surface of the substrate may be configured so as to have a greater weighted average reflection (WAR) than the front surface of the substrate (e.g. for wavelengths in the 400 nm to 1000 nm range). The rear surface of the substrate may be configured so as to have a WAR (e.g. for wavelengths in the 400 nm to 1000 nm range) that is greater than 13% (i.e. more than 13% of the photons hitting the rear surface are reflected, as measured from the rear). The front surface of the substrate may be configured so as to have a WAR (e.g. for wavelengths in the 400 nm to 1000 nm range) that is 13% or less.

The WAR may be calculated by integrating the reflectance (of the surface) over the wavelength range. The weightage of reflectance of the wavelength is determined by the photon flux.

The substrate, or a portion thereof, may be positively or negatively doped (i.e. may be a p-type or an n-type semiconductor). Thus, the substrate may comprise an n-type or p-type semiconductor material. When the semiconductor material is an n-type semiconductor material, the semiconductor material may be configured to contain impurities of a group V element such as phosphor (P), arsenic (As), and antimony (Sb). When the semiconductor material is a p-type semiconductor material, it may contain impurities of a group III element such as boron (B), gallium (Ga), and indium (In). The substrate may comprise crystalline silicon (c-Si). Alternatively, the semiconductor material may be formed of materials other than silicon.

The emitter may comprise nanocrystalline silicon (nc-Si), or amorphous silicon (a-Si) (or silicon carbide or silicon suboxide). The doping of the emitter may be opposite to that of the substrate. For example, when the substrate is negatively doped, the emitter may be a p-type emitter.

The solar cell may comprise a doped layer that is arranged on the opposite surface of the substrate to the emitter. The doped layer may comprise a nanocrystalline material (e.g. nanocrystalline silicon (nc-Si)), or an amorphous material (e.g. amorphous silicon (a-Si)). The doped layer may comprise e.g. silicon, silicon carbide or silicon suboxide. The doped layer may have the same doping as the substrate (e.g. the doped layer may define an accumulator layer). Thus, when the substrate is negatively doped, the doped layer may be an n-type layer.

The front side of the layered structure may comprise the doped layer (which may be referred to as a front doped layer). The front doped layer may be arranged on the front surface of the substrate.

The solar cell may be a heterojunction solar cell, that is, a solar cell made using heterojunction technology (HJT). For example, the substrate may be formed of crystalline silicon, whereas the emitter and accumulator may be formed of amorphous silicon. Accordingly, an interface layer may be arranged between the emitter and the surface (e.g. rear surface) of the substrate.

The interface layer may comprise amorphous silicon. The interface layer may comprise intrinsic amorphous silicon (i-a-Si) or intrinsic amorphous silicon oxide (i-a-SiOx). The interface layer may comprise a-SiCx(i), poly silicon, SiO2, Al2O3, SiNx, or TiOx. The interface layer may be configured to provide passivation (i.e. it may be configured to further decrease the recombination of charge carriers at the substrate surface).

The interface layer may be a first interface layer, and the layered structure may comprise a second interface layer arranged between the doped layer and the surface (e.g. front surface) of the substrate. The second interface layer may be positioned on the opposite side of the substrate to the emitter. The second interface layer may comprise intrinsic amorphous silicon (i-a-Si) or intrinsic amorphous silicon oxide (i-a-SiOx). The second interface layer may comprise i-a-SiCx, poly silicon, SiO2, Al2O3, SiNx, or TiOx. Like the first interface layer, the second interface layer may be configured to provide passivation (i.e. it may be configured to further decrease the recombination of charge carriers at the substrate surface).

The solar cell may comprise a reflector layer. The reflector layer may be arranged on (e.g. indirectly on) the rear surface of the substrate. The reflector layer may form part of the rear side of the layered structure. The reflector layer may be rearward of the emitter. The reflector layer may be arranged on (i.e. directly or indirectly on) the emitter.

The reflector layer may be multi-layered (i.e. it may comprise a plurality of sub-layers). One or more of the sub-layers may be configured to maximise the reflectiveness of the reflector layer (to light incident thereon). The reflector layer (or a selection of the sub-layers thereof) may be configured as a dielectric mirror. The refractive indices of each sub-layer may be configured to maximise reflection of light incident on the reflector layer.

The reflector layer may comprise a first sub-layer having a first refractive index and a second sub-layer having a second refractive index that is higher than the first refractive index. The first and second sub-layers may be adjacent one another (i.e. the first sub-layer may be arranged directly on the second sub-layer). The first sub-layer may be rearward of the second sub-layer (e.g. the first sub-layer may be further from the substrate compared to the second sub-layer).

The first sub-layer may comprise silicon oxynitride (SiOyNx). The tuning, as discussed above, may comprise selecting the oxygen content of the SiOyNx sub-layer to provide a particular refractive index (e.g. that is lower than the refractive index of the second sub-layer).

The first sub-layer may comprise silicon dioxide ($SiO_2$). The first sub-layer may comprise a dielectric film (e.g. silicon nitride (SiNx)).

The first sub-layer may have a thickness that is between 1 and 50 nm, or between 1 and 40 nm, or between 1 and 30 nm, or between 1 and 20 nm. The first sub-layer may have a thickness that is about 10 nm.

The first sub-layer may have a refractive index that is below 1.8 for a wavelength of 633 nm. The first sub-layer may have a refractive index between 1.3 and 1.7, or between 1.4 and 1.6, for a wavelength of 633 nm. The first sub-layer may have a refractive index of about 1.5 for a wavelength of 633 nm.

The second sub-layer may comprise transparent conductive oxide (TCO), such as indium tin oxide (ITO). Alternatively or additionally, the second-sub layer may comprise any one of IZO (indium zinc oxide), AZO (aluminium zinc oxide) and IWO (indium tungsten oxide).

The second sub-layer may have a thickness that is between 30 and 100 nm, or between 30 and 80 nm, or between 30 and 50 nm. The TCO layer may have thickness that is about 40 nm.

The second sub-layer may have a refractive index that is above 1.8 for a wavelength of 633 nm. The second sub-layer may have a refractive index of between 1.8 and 2.2, or between 1.9 and 2.1, for a wavelength of 633 nm. The second sub-layer may have a refractive index of about 2 nm for a wavelength of 633 nm.

The reflector layer may comprise a third sub-layer. The second sub-layer may be arranged directly on the third sub-layer (i.e. the second sub-layer may be rearward of the third sub-layer or further from the substrate compared to the third sub-layer). The third sub-layer may comprise a transition metal oxide (TMO) layer. The provision of a TMO sub-layer, due to its refractive index, may improve reflectance, to increase reflection of light prior to it reaching the second sub-layer. The third sub-layer may comprise at least one of WOx (e.g. $WO_3$), MoOx, $V_2O_5$, CuOx, NiOx, TiOx, LiFx, KFx, TaNx, and ZnO.

The third sub-layer may have a refractive index of between 1.8 and 2.2, or between 1.9 and 2.1, for a wavelength of 633 nm. The third sub-layer may have a refractive index of about 2 nm for a wavelength of 633 nm.

The reflector layer may be tuned to the rear surface morphology of the substrate (i.e. so as to maximise reflection by the reflector layer). Such tuning may comprise selecting one or more physical characteristics of the sub-layers in order to maximise a performance characteristic (e.g. the short circuit current (Isc) or short circuit current density ($J_{SC}$)) of the solar cell with a given rear surface morphology. The one or more physical characteristics may include one or more of the thickness of each sub-layer, the material (and thus the refractive index) of each sub-layer and/or the number of sub-layers.

Thus, more generally, the sub-layers of the reflector layer may be configured so as to maximise reflectance (and thus short circuit current and/or short circuit current density) for the rear surface morphology of the substrate of the solar cell.

In one example, the solar cell may comprise a first sub-layer formed of silicon dioxide having a thickness of about 10 nm, a second sub-layer formed of ITO having a thickness of about 40 nm and a substrate having a rear surface morphology formed of 30 degree pyramids.

The solar cell may comprise a rear electrode. The rear electrode may be arranged on a rear surface (i.e. the rearmost surface) of the layered structure.

The layered structure may further comprise an anti-reflection layer. The anti-reflection layer may form part of the front side of the layered structure. The anti-reflection layer may be arranged on (e.g. directly on) the doped layer or emitter (depending on which forms part of the front side of the layered structure). The front TCO layer may define a front (i.e. frontmost) surface of the layered structure. The anti-reflection layer may be formed of a transparent conductive oxide (TCO), such as indium tin oxide (ITO). The anti-reflection layer may reduce the reflectance of light incident on the solar cell and increase selectivity of a predetermined wavelength band, thereby increasing the efficiency of the solar cell.

In general, the layered structure may include one or more layers (and/or sub-layers) formed of or comprising SiOxNy, SiNx, SiOx, SiC, ITO, IZO, AZO, IWO, WOx (e.g. $WO_3$), MoOx, $V_2O_5$, CuOx, NiOx, TiOx, LiFx, KFx, TaNx, and ZnO.

The solar cell may comprise a front electrode. The front electrode may be arranged on a front surface (i.e. a frontmost surface) of the layered structure.

In a second aspect there is provided a method of forming a layered structure of a solar cell, the method comprising:

performing a first finishing process on a first surface of a solar cell substrate to provide the first surface with a first surface morphology;

performing a second finishing process on a second surface of the solar cell substrate, opposite the first surface, to provide the second surface with a second surface morphology; and arranging an emitter on the second surface of the solar cell substrate;

wherein the first and second surface morphologies are such that the first surface has a greater surface area than the second surface.

As per the discussion provided above, the term "on" encompasses both indirect (with intervening layers) and direct (without intervening layer) arrangement of the on the second surface of the solar cell substrate.

The method may comprise performing (additionally) the first finishing process on the second surface (so as to provide the second surface with the first surface morphology). In this case, the second finishing process may be performed after the first finishing process.

In some embodiments, the first finishing process may be applied to the first surface only (i.e. the first surface, but not the second surface). For example, the first finishing process may comprise applying a texture to the first surface only.

The first finishing process may be a texturing process. The first finishing process may be an etching process. For example, the etching process may comprise immersing the substrate in a chemical bath. The first surface morphology may be a pyramid texture.

The second finishing process may comprise a polishing or etching (e.g. micro-etching) process.

The second finishing process may comprise single side inline etching (e.g. alkaline or acid etching).

The second finishing process may alternatively comprise depositing a protective layer on the first surface and subsequently performing an etching process on the substrate (i.e. such that etching only occurs on the unprotected second surface). The protective layer may comprise silicon nitride (SiNx). The method may further comprise removing the protective layer from the first surface, subsequent to performing the etching process.

Where the first finishing process is applied to both the first and second surfaces, the second finishing process may thus comprise transforming the surface morphology of the second surface, from the first surface morphology to the second surface morphology.

As an example, the first finishing process may comprise forming a first surface morphology, e.g. comprising a pyramid texture, on the second surface. The second finishing process may comprise polishing the pyramid texture to form a bumped surface, in which the top portion of each pyramid is removed (i.e. defining the second surface morphology).

The first surface may be a front surface of the substrate. The second surface may be a rear surface of the substrate.

The layered structure of the second aspect may be as otherwise described with respect to the first aspect.

The method may further comprise arranging one or more layers on the first and/or second surfaces of the substrate (i.e. in addition to the emitter).

Arranging the one or more layers on the substrate may comprise depositing, implanting and/or diffusing the one or more layers on the first and/or second surfaces (e.g. by way of a vapour deposition process). The one or more layers deposited on the first and/or second surfaces may include one or more of an (e.g. first and/or second) interface layer, reflector layer, doped layer and/or anti-reflection layer (each being as described above with respect to the first aspect).

Arranging the emitter on the substrate may comprise depositing, implanting and/or diffusing the emitter on the second surface (e.g. by way of a vapour deposition process).

In a third aspect, there is provided a method of determining the configuration of a solar cell of the first aspect, the method comprising:

selecting one or more substrate rear surface morphologies;

selecting a plurality of rear reflector layer configurations;

identifying a plurality of combinations of substrate rear surface morphology and rear reflector layer configuration from the one or more selected substrate rear surface morphologies and selected rear reflector layer configurations;

determining, for each combination, a performance characteristic of a solar cell having the combination of rear surface morphology and rear reflector layer configuration; and identifying the combination having the highest performance, by comparing the determined performance characteristics of the combinations.

The performance characteristic may be the short circuit current ($I_{SC}$) of the solar cell or the short circuit current density ($J_{SC}$) of the solar cell.

Each rear reflector layer configuration may comprise the configuration of the sub-layers of the rear reflector layer. The configuration of the sub-layers of the reflector may comprise the physical characteristics of each sub-layer. The physical characteristics of each sub-layer may include one or more of the thickness of the sub-layer, refractive index of the sub-layer (e.g. at a given wavelength) and/or the material from which the sub-layer is formed. The configuration of the sub-layers may comprise the number of sub-layers.

The step of determining the performance characteristics may be performed using an optical simulator. The optical simulator may be applied to a plurality of computer simulated solar cell models having the identified combinations of substrate rear surface morphology and rear reflector layer configuration.

The selection of morphologies may comprise selecting one or more of a flat (i.e. smooth, planar) surface morphology, a polished pyramid morphology (i.e. pyramids having their peaks removed), pyramids formed of 30 degree sloped surfaces and/or a smooth bump morphology.

In a fourth aspect, there is provided a method of forming a layered structure of a solar cell, the method comprising performing the method of the third aspect and forming a layered structure having the substrate rear surface morphology and rear reflector layer configuration identified as having the highest performance.

The forming of the layered structure of the fourth aspect may be as otherwise described above with respect to the second aspect. Accordingly, the second surface morphology referred to in the second aspect may be the substrate rear surface morphology of the combination identified as having the highest performance. That is, the method may comprise (in regards to the forming of the substrate) performing the second finishing process on the second surface of the substrate to provide the rear surface morphology of the identified combination.

In a fifth aspect, there is provided a layered structure formed according to the method of the fourth aspect.

The layered structure of the fifth aspect may be as otherwise described above with respect to the first aspect.

The skilled person will appreciate that except where mutually exclusive, a feature or parameter described in relation to any one of the above aspects may be applied to any other aspect. Furthermore, except where mutually exclusive, any feature or parameter described herein may be applied to any aspect and/or combined with any other feature or parameter described herein.

BRIEF DESCRIPTION OF THE DRAWINGS

Embodiments will now be described by way of example only, with reference to the figures, in which.

DETAILED DESCRIPTION

Aspects and embodiments of the present disclosure will now be discussed with reference to the accompanying figures. Further aspects and embodiments will be apparent to those skilled in the art. In the figures, the thicknesses of the layers are exaggerated for clarity. Also, the relative thicknesses of the layers shown in the figures is not necessarily representative of the actual relative thicknesses of the layers in all embodiments.

Figures 1, 2:
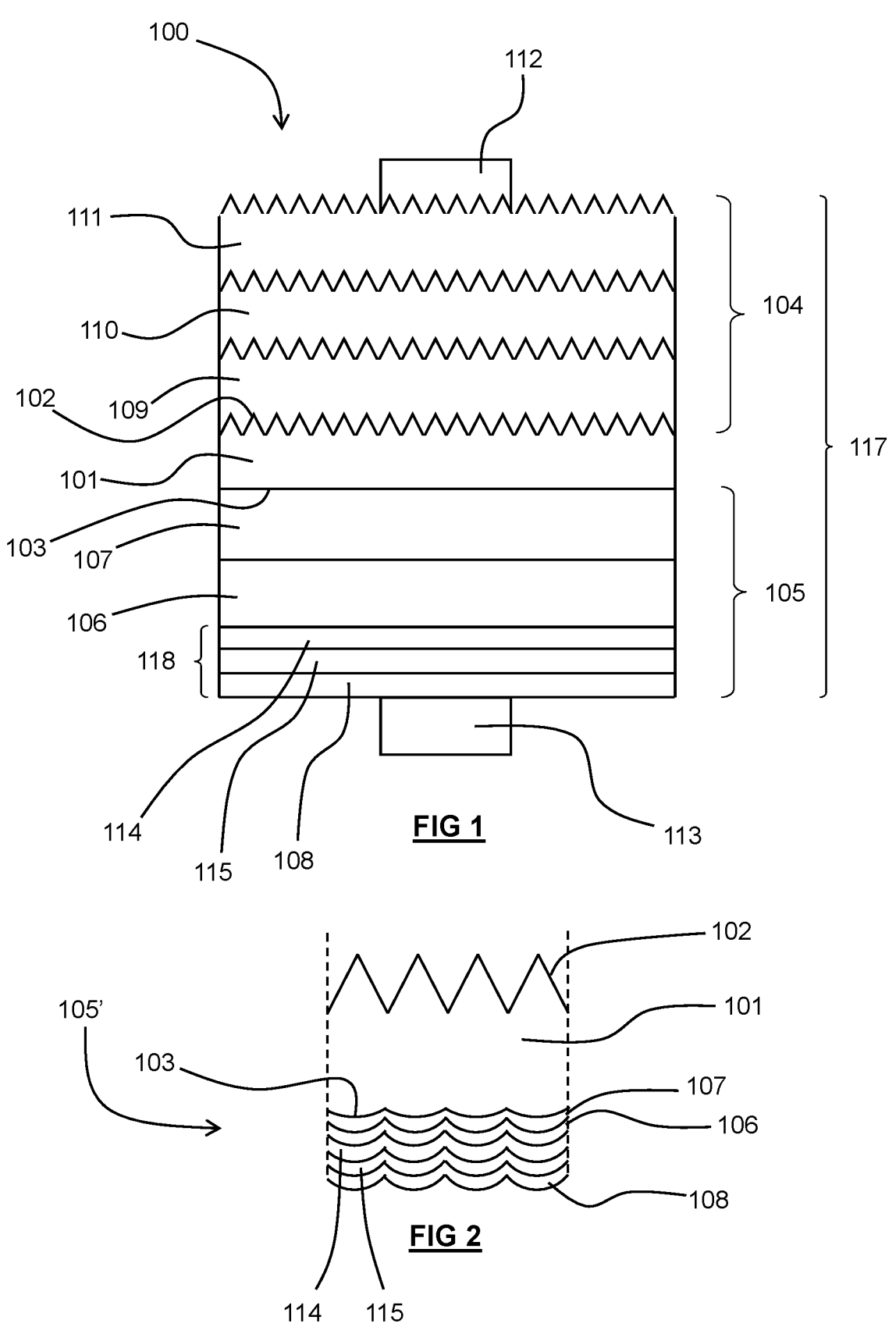
FIG. 1 is a side cross-sectional view of a solar cell.
FIG. 2 is a side cross-sectional view of a portion of a variation of the solar cell of FIG. 1.

FIG. 1 schematically illustrates a solar cell 100 comprising, among other layers, a crystalline silicon substrate 101 comprising a first (i.e. front) surface 102, upon which light (e.g. from the sun) is first incident in normal use, and a second (i.e. rear) surface 103 that is opposite the front surface 102. As is apparent from FIG. 1, the front surface 102 has a pyramid texture and the rear surface 103 is smooth and planar (i.e. has no substantial texture applied thereto). This results in the front surface 102 having higher roughness than the rear surface 103. The greater roughness of the front surface 102, means that the surface area of the front surface 102 is larger than the surface area of the rear surface 103.

The substrate 101 forms part of a layered structure 117 of the solar cell 100. The substrate 101 divides the layered structure 117 into a front side (or portion) 104 that is forward of the substrate 101 (but includes the front surface 102), and a rear side (or portion) 105 that is rearward of the substrate 101 (but includes the rear surface 103). Light incident on the solar cell 100, in normal use, passes through the front side 104 of the layered structure 117 and the substrate 101, before entering the rear side 105 of the layered structure 117.

Each of the front 104 and rear sides 105 of the layered structure 117 comprises a plurality of layers. The layers of the front side 104 are deposited (or e.g. diffused or implanted) on the front surface 102 of the substrate 101. The layers of the rear side 105 are deposited (or e.g. diffused or implanted) on the rear surface 103 of the substrate 101. The layers are deposited as thin coatings, such that each layer takes the shape of the surface on which it is deposited. As a result (and as is apparent from the figure), the layers of the front side 104 each have greater surface areas than the layers of the rear side 104.

The lower surface area of the rear surface 103 of the substrate 101 increases passivation at the rear surface 103 by reducing charge carrier recombination (i.e. the lower surface areas reduces the number of defect sites at the rear surface 103). The lower surface area of the rear surface 103 of the substrate 101 may also reduce manufacturing costs. This is because, the reduced surface area requires a smaller quantity of material to be deposited thereon, and less time to do so.

The solar cell 100 is a rear emitter solar cell (and, in particular, a rear emitter heterojunction solar cell 100). As such, the emitter 106 of the solar cell 100 forms part of the rear side 105 of the layered structure 117. The emitter 106 forms a p-n junction with the substrate 101 and, in the illustrated embodiment, is a p-type nanocrystalline silicon layer (p-nc-Si). In other embodiments, the substrate may be formed of an n-type material.

A first interface layer 107 is provided between the emitter 106 and the substrate 101. The first interface layer 107 is configured to further increase passivation at the rear surface 103. The emitter 106 is arranged directly on the first interface layer 107, which is in turn arranged directly on the rear surface 103 of the substrate 101. The first interface layer 107 is an intrinsic amorphous silicon (i-a-Si) layer. The first interface layer 107 may otherwise comprise, for example, a-SiOx(i), a-SiCx(i), poly silicon, SiO2, Al2O3, SiNx or TiOx.

The layered structure 117 comprises a reflector layer 118 formed of three sub-layers: a first sub-layer 108 comprising silicon oxynitride, a second sub-layer in the form of a TCO layer 115, and third sub-layer comprising a transparent metal oxide (TMO) 114. The reflector layer 118 is arranged on a rear surface of the emitter 106. The TMO layer 114 is arranged directly on the rear surface of the emitter 106, and the TCO layer 115 is provided rearward of the TMO layer 114. The TMO layer 114 and TCO layer 115 are sandwiched between the emitter 106 and the first sub-layer 108, which defines the most rearward layer of the layered structure 117.

The sub-layers of the reflector layer 118 are configured to maximise reflection of light, incident thereon, back into the substrate 101. In particular, the refractive indices of the sub-layers 108, 114, 115 are tuned so as to maximise the reflection of light having a wave length from 400 nm to 1000 nm. In this way, the reflector layer 118 may be configured as a dielectric mirror.

One aspect of tuning the refractive indices of the sub-layers 108, 114, 115, includes managing the oxygen content of the silicon oxynitride of the first sub-layer, to alter the refractive index of the first sub-layer The reflector layer 118 is particularly tuned according to the surface morphology of the rear surface 103 of the substrate 101. The surface morphology of the rear surface 103 of the substrate 101 affects the angle of incidence of light that is incident on the reflector layer 118. Accordingly, the thicknesses and refractive indices of the sub-layers 108, 114, 115 are selected to maximise reflection of light incident back towards the substrate 101 at that particular angle of incidence. Preferred parameters (thickness and refractive index) may, for example, be determined using a ray trace simulator.

The front side 104 of the solar cell 100 comprises, in order moving away from the substrate 101, a second interface layer 109, a front doped layer 110 and a front TCO layer 111. The second interface layer 109, in the illustrated embodiment, is an intrinsic amorphous silicon (i-a-Si) layer. The front doped layer is an n-type amorphous silicon (n-a-Si) layer.

The solar cell 100 is further provided with a front electrode 112, arranged on a front surface of the TCO layer 111, and a rear electrode 113 arranged on a rear (e.g. rearmost) surface of the reflector layer 118.

FIG. 2 illustrates a rear side 105' of a layered structure that is a variation of that shown in FIG. 1. In this embodiment, the rear surface 103 of the substrate 101 comprises a bumped surface morphology instead of a smooth planar surface morphology (as was the case with the previously described embodiment). The bumped surface is formed by polishing the rear surface 103 of the substrate 101 to partially remove the texture of the rear surface 103 (i.e. removing the tips of pyramids formed on the rear surface 103).

By doing so, the surface area of the rear surface 103 is reduced, making it smaller than the surface area of the front surface 102 of the substrate 101. The smaller surface area increases passivation and also means that the layers deposited (or otherwise disposed on) the rear surface 103 require less material and less time to be disposed thereon.

Like the embodiment of FIG. 1, the rear side 105' comprises, in order moving away from the rear surface 103, an interface layer 107, an emitter 106, a TMO layer 114, a TCO layer 115, and a reflector layer 118.

Figure 3:
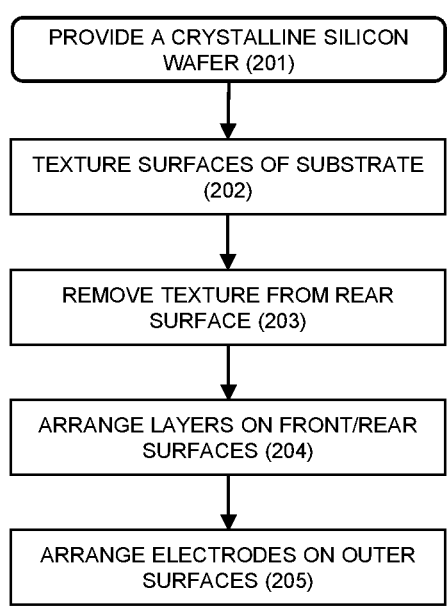
FIG. 3 is a flow chart illustrating a method of forming a solar cell.

FIG. 3 depicts a method 200 of forming a solar cell, such as one of the solar cells described above. The method comprises a first step 201 of providing a solar cell substrate in the form of a crystalline silicon wafer. In a second step 202, a first finishing process is performed on the front and rear surfaces of the substrate. In particular, the first finishing process comprises applying a texture to the front and rear surfaces. This may be performed, for example, by etching the front and rear surfaces to form a pyramid texture on the front and rear surfaces.

In a third step 203, the method comprises (in a second finishing process) at least partially removing the pyramid texture from the rear surface. This may involve polishing the rear surface to partially remove the pyramid texture (e.g. removing the tips of the pyramids). The result of this step is that the rear surface has a smaller surface area than the front surface of the substrate.

In a fourth step 204 layers are arranged (or formed) on the front and rear surfaces of the substrate. This may comprise e.g. depositing, diffusing, doping and/or implantation steps. The layers referred to are those forming the front and rear sides of the solar cells described above (e.g. the emitter 106, reflector layer 118 and sub-layers, etc.).

The fourth step 204 (although not specifically illustrated) includes forming the reflector layer, which involves depositing a plurality of sub-layers (e.g. via a PECVD process). The deposition of the sub-layers may be such that the refractive indices of the sub-layers varies (between sub-layers). The thickness of the sub-layers may also vary. In general, the sub-layers of the reflector layer are tuned to maximise reflection.

The sub-layer thicknesses and materials are selected by way of an optimisation process, which is discussed further below.

In a fifth step 205, electrodes are arranged on the outermost surfaces of the front and rear sides of the solar cell.

Figures 4, 5:
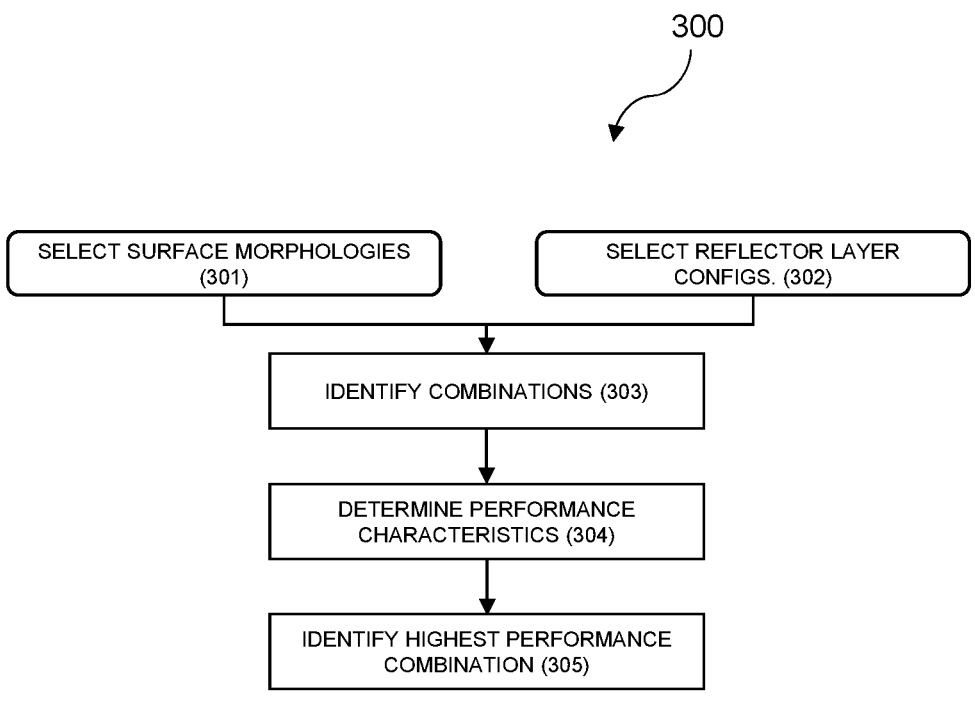
FIG. 4 is a flow chart illustrating a method of determining the configuration of a solar cell.
FIG. 5 is a table exemplifying the method of FIG. 4.

FIG. 4 illustrates a method 300 for determining the configuration of a solar cell, such as that described above. This method 300 comprises, at block 301, selecting one or more substrate rear surface morphologies. In this case, the surface morphologies include a smooth/planar surface morphology (morphology 1) and a 30 degree pyramid morphology (morphology 2) formed of a plurality of pyramids, each having slope angles of 30 degrees.

At block 302, a plurality of reflector layer configurations are selected. Each reflector layer configuration comprises the configuration of the sub-layers of the reflector. This includes the number of sub-layers and the physical characteristics of each sub-layer. The physical characteristics include sub-layer thickness and material.

At block 303 a plurality of combinations of rear surface morphology and reflector layer configuration are identified from the selected rear surface morphologies and reflector layer configurations (i.e. such that each combination is made up of a rear surface morphology and a reflector layer configuration). The identified combinations may include all possible combinations, or a subset of all possible combinations.

At block 304 each of the identified combinations is assessed to determine a performance characteristic of a solar cell having that combination. This may be performed, for example, by way of an optical simulator. Thus, for example, a computer simulated solar cell model may be formed for each combination (i.e. the solar cell model having the rear surface morphology and reflector layer configuration of the combination) and an optical simulation may be performed on the computer simulated solar cell model. In this way, a solar cell performance may be determined for each combination of rear surface morphology and rear reflector layer configuration. The performance characteristic may be e.g. the short circuit current ($I_{SC}$) of the solar cell or the short circuit current density ($J_{SC}$) of the solar cell.

At block 305 the highest performing combination is identified. For example when the performance characteristic is the short circuit current or the short circuit current density, the highest performing combination may be that with the highest short circuit current or short circuit current density.

This process is exemplified by the table provided in FIG. 5. In this example, eight reflector layer configurations are selected (corresponding to the eight rows of the table). Each reflector layer configuration comprises two sub-layers of different material and different thickness. Additionally, two substrate rear surface morphologies have been selected for consideration.

This lead to a total of 16 combinations of rear surface morphologies and reflector layer configuration.

As is apparent, a performance characteristic (in this case short circuit current density) has been calculated for each of the 16 combinations. This has been performed by way of an optical simulator based on computer simulated solar cell models having the reflector layer configurations and surface morphologies of the various combinations.

The highest determined value of short circuit current density is 41.3 (mA/cm2), which is outlined in FIG. 5. This corresponds to a substrate having rear surface morphology 2, a first sub-layer formed of material 1 with a thickness of 40 nm, and a second sub-layer formed of material 2 with a thickness of 10 nm.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

The invention claimed is:

1. A solar cell comprising:
   a substrate having a front surface configured to face a light source in use, and a rear surface opposite the front surface, the front surface having a front surface morphology and the rear surface having a rear surface morphology, wherein the front and rear surface morphologies are configured such that the front surface has a greater surface area than the rear surface;
   an emitter arranged on the rear surface of the substrate;
   a reflector layer arranged on the rear surface of the substrate, the reflector layer comprising a first sub-layer having a first refractive index and a second sub-layer having a second refractive index that is greater than the first refractive index, and wherein the first sub-layer is rearward of the second sub-layer; and
   wherein the first sub-layer comprises a dielectric film, and wherein the second sub-layer comprises a transparent conductive oxide.

2. A solar cell according to claim 1 wherein the front surface morphology comprises a texture.

3. A solar cell according to claim 1, wherein the rear surface morphology is smooth and planar.

4. A solar cell according to claim 1, wherein the rear surface morphology comprises a polished texture.

5. A solar cell according to claim 1, wherein a surface roughness of the front surface of the substrate is greater than a surface roughness of the rear surface of the substrate.

6. A solar cell according to claim 1, wherein the rear surface of the substrate is configured to have a greater weighted average reflection than the front surface of the substrate for wavelengths between 400 nm and 1000 nm.

7. A solar cell according to claim 6, wherein the rear surface of the substrate is configured to have a weighted average reflection that is greater than 13%.

8. A solar cell according to claim 1, wherein an interface layer is provided between the emitter and the rear surface of the substrate.

9. A solar cell according to claim 1 wherein the first sub-layer comprises silicon oxynitride.

10. A solar cell according to claim 1, wherein the reflector layer comprises a third sub-layer comprising a transparent metal oxide (TMO).

11. A solar cell according to claim 1, the solar cell being a heterojunction solar cell.

12. A solar cell according to claim 1, wherein the front surface morphology comprises a pyramid texture.

13. A solar cell according to claim 12, wherein the rear surface morphology comprises a pyramid texture.

14. A solar cell as claimed in claim 13, wherein a slope angle of a plurality of pyramids of the rear surface morphology is less than a slope angle of a plurality of pyramids of the front surface morphology.

15. A solar cell as claimed in claim 14, wherein the slope angle of the plurality of pyramids of the rear surface morphology is between about 40% to 60% of the slope angle of the plurality of pyramids of the front surface morphology, and optionally wherein the slope angle of the plurality of pyramids of the rear surface morphology is about 50% of the slope angle of the plurality of pyramids of the front surface morphology.

16. A solar cell as claimed in claim 1, wherein the first sub-layer has a refractive index of less than 1.8 for a wavelength of 633 nm, and optionally wherein the first sub-layer has a refractive index of between 1.3 and 1.7 for a wavelength of 633 nm, and optionally wherein the first sub-layer has a refractive index of between 1.4 and 1.6 for a wavelength of 633 nm.

17. A solar cell as claimed in claim 16, wherein the second sub-layer has a refractive index greater than or equal to 1.8 for a wavelength of 633 nm, and optionally wherein the second sub-layer has a refractive index of between 1.8 and 2.2 for a wavelength of 633 nm, and optionally wherein the second sub-layer has a refractive index of between 1.9 and 2.1 for a wavelength of 633 nm.

18. A solar cell as claimed in claim 1, wherein the first sub-layer comprises silicon oxynitride and the second sub-layer comprises one of: indium tin oxide; indium zinc oxide; aluminum zinc oxide; and indium tungsten oxide.

19. A solar cell comprising:

a substrate having a front surface configured to face a light source in use, and a rear surface opposite the front surface, the front surface having a front surface morphology and the rear surface having a rear surface morphology, wherein the front and rear surface morphologies are configured such that the front surface has a greater surface area than the rear surface;

an emitter arranged on the rear surface of the substrate;

a reflector layer arranged on the rear surface of the substrate, the reflector layer comprising a first sub-layer having a first refractive index and a second sub-layer having a second refractive index that is greater than the first refractive index, and wherein the first sub-layer is rearward of the second sub-layer; and wherein the front surface morphology comprises a pyramid texture;

wherein the rear surface morphology comprises a pyramid texture; and wherein a slope angle of a plurality of pyramids of the rear surface morphology is less than a slope angle of a plurality of pyramids of the front surface morphology.

20. A solar cell as claimed in claim 19, wherein the slope angle of the plurality of pyramids of the rear surface morphology is between about 40% to 60% of the slope angle of the plurality of pyramids of the front surface morphology, and optionally wherein the slope angle of the plurality of pyramids of the rear surface morphology is about 50% of the slope angle of the plurality of pyramids of the front surface morphology.

* * * * *